United States Patent [19]

van Tuijl

[11] Patent Number: 4,633,100
[45] Date of Patent: Dec. 30, 1986

[54] DARLINGTON TRANSISTOR ARRANGEMENT

[75] Inventor: Adrianus J. M. van Tuijl, Nijmegen, Netherlands

[73] Assignee: U.S. Philips Corporation, New York, N.Y.

[21] Appl. No.: 706,066

[22] Filed: Feb. 27, 1985

[30] Foreign Application Priority Data

Feb. 29, 1984 [NL] Netherlands ............... 8400635

[51] Int. Cl.⁴ .................. H03K 3/26; H03F 3/04
[52] U.S. Cl. ..................... 307/315; 307/255; 307/288; 307/297; 330/288
[58] Field of Search .............. 307/315, 254, 255; 330/257, 288; 323/315

[56] References Cited

U.S. PATENT DOCUMENTS

| | | | |
|---|---|---|---|
| 3,979,606 | 9/1976 | Ahmed | 307/296 |
| 4,371,792 | 2/1983 | Dobkin | 307/315 |
| 4,467,226 | 8/1984 | Nagasawa | 307/315 |
| 4,542,399 | 9/1985 | Monticelli | 307/315 |

Primary Examiner—Stanley D. Miller
Assistant Examiner—B. P. Davis
Attorney, Agent, or Firm—Thomas A. Briody; William J. Streeter; Marianne R. Rich

[57] ABSTRACT

The emitter of an input transistor ($T_1$) of a Darlington transistor is connected to the base of an output transistor ($T_2$). The collector of the input transistor ($T_1$) is connected to the input of a current amplifier circuit comprising a third transistor ($T_3$) arranged as a diode and having a first resistor ($R_1$) arranged in its emitter circuit, and a fourth transistor ($T_4$) having its base is connected to that of the third transistor ($T_3$) and having a second resistor ($R_2$) arranged in the emitter circuit. The collector of the fourth transistor ($T_4$) is connected to the base of the output transistor ($T_2$). The ratio between the resistance values of the first and the second resistors ($R_1$, $R_2$) is larger than the ratio between the emitter areas of the fourth and the third transistor ($T_4$, $T_3$). Thus, for small currents a low and for large currents a high current gain is obtained, so that the current gain factor of the output transistor ($T_2$) which decreases for large currents is compensated for partly. Moreover, the base current of the input transistor ($T_1$) remains small in the case of large output currents.

4 Claims, 4 Drawing Figures

DARLINGTON TRANSISTOR ARRANGEMENT

BACKGROUND OF THE INVENTION

1. Field of the Invention

The invention relates to a Darlington transistor arrangement comprising an input transistor having a collector, a base and an emitter and an output transistor having a collector, a base and an emitter, the emitter of the input transistor driving the base of the output transistor.

2. Description of the Prior Art

Such Darlington arrangements are known for example from Tietze, Schenk, Halbleiterschaltungstechnik, 1978, pages 56–58 and may be employed for example as power transistors in audio amplifiers.

Since the emitter current of the input transistor is equal to the base current of the output transistor when signal current is considered, the current gain factor of such a Darlington arrangement is equal to the product of the current gain factors of the input transistor and the output transistor. When the arrangement is used as a power transistor, in which case the output transistor must be capable of delivering large currents, the base current of the input transistor should not become too large in view of the load presented to the driver stage. Therefore, in order to preclude overloading of the driver stage, the arrangement is generally preceded by an additional transistor whose emitter current is equal to the base current of the input transistor. However, this additional transistor has the disadvantage that a supply voltage which is equal to at least three base-emitter voltages is required for a satisfactory operation of the arrangement. Therefore, the arrangement is not suitable for use with very low supply voltages.

Further, a Darlington arrangement has the problem that the current-gain factor of the output transistor decreases in the case of large currents. This gives rise to a highly non-linear relationship between the output current of the output transistor and the base current of the input transistor, causing distortion of the output signal.

SUMMARY OF THE INVENTION

It is the object of the present invention to provide a Darlington transistor arrangement whose input transistor requires comparatively small base currents for large output currents, which is suitable for use at comparatively low supply voltages, and in which the relationship between the output current and the base current is substantially linear. According to the invention a Darlington transistor arrangement of the type specified in the opening paragraph is characterized in that the collector of the input transistor is connected to the input of a current amplifier circuit which amplifies the collector current of the input transistor and supplies it to an output which is connected to the base of the output transistor, the current amplifier circuit is a current mirror circuit comprising an input-current path which is connected to the collector of the input transistor and which comprises the series arrangement of the collector-emitter path of a first transistor and a first resistor, and an output current path which is connected to the base of the output transistor and which comprises the series arrangement of the collector-emitter path of a second transistor, whose base-emitter junction is arranged in parallel with the base-emitter junction of the first transistor, and a second resistor, and the ratio between the resistance values of the first and the second resistor is larger than the ratio between the emitter areas of the second and the first transistor.

By amplifying the collector current of the input transistor by means of the current amplifier circuit and applying it to the base of the output transistor, the base current of the output transistor and hence the overall current gain factor of the arrangement is increased. To obtain a specific output current the base current required for the input transistor is therefore smaller. For example, if the current gain factor of the current amplifier circuit is two, only one third of the original base current is required in order to obtain a specific output current. As the arrangement requires only two base-emitter voltages, it is also suitable for use with comparatively lower supply voltages. The use of a current mirror circuit as a current amplifier circuit results in a simple construction of the arrangements. The use of current mirror circuits as current amplifier circuits is known per se, for example from Valvo Berichte, Band xlx, Heft 3, pages 107 to 114.

The relationship between the output current and the base current of the input transistor is linearised by selecting the ratio between the resistance values of the first and the second resistor to be larger than the ratio between the emitter areas of the second and the first transistor. For small currents the current gain factor is determined mainly by the ratio between the emitter areas of the second and the first transistor, and for large currents the current gain factor is determined by the ratio between the resistance values of the first and the second resistor, yielding a small gain factor for small currents and a large current gain factor for large currents.

A suitable and simple construction of such a current mirror is obtained if, in accordance with a further characteristic feature, the collector of the first transistor is connected to its base.

BRIEF DESCRIPTION OF THE DRAWING

The invention will now be described in more detail, by way of example, with reference to the accompanying drawing, in which.

DESCRIPTION OF THE PREFERRED EMBODIMENTS

Figure 1:
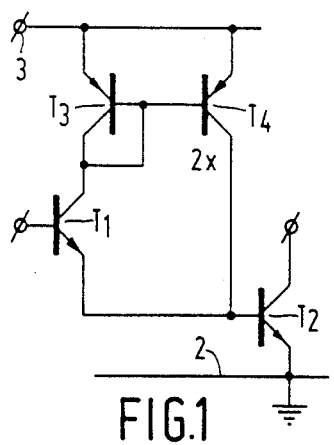
FIG. 1 shows a Darlington transistor arrangement provided with a current amplifier circuit having a constant current gain factor.

FIG. 1 shows a Darlington transistor arrangement with a current amplifier circuit to explain the arrangement in accordance with the invention, which amplifier circuit has a current gain factor which is independent of the magnitude of the output current. In this Figure the emitter of an NPN input transistor $T_1$ is connected to the base of an NPN output transistor $T_2$, whose emitter in the present example is connected to the negative power-supply terminal 2, in the present case to earth. A load to which the output current of the Darlington arrangement can be delivered may be connected to the collector of the output transistor $T_2$. The collector of the input transistor $T_1$ is connected to the input of a current mirror circuit comprising a PNP transistor $T_3$ arranged as a diode and having its emitter connected to the positive power-supply terminal 3 and an PNP transistor $T_4$ whose base-emitter junction is connected in parallel with that of the transistor $T_3$. In the present example the emitter area of transistor $T_4$ is twice as large as that of transistor $T_3$. Since transistors $T_3$ and $T_4$ have the same base-emitter voltages the collector current of transistor $T_4$ will be twice as large as the collector current of $T_3$ and consequently as the collector current of input transistor $T_1$. The collector current of transistor $T_4$ together with the emitter current of transistor $T_1$ is applied to the base of the output transistor $T_2$. If it is assumed that the collector current of transistor $T_1$ is substantially equal to the emitter current, the overall current gain factor of the arrangement will be equal to $(\beta_1 + 2\beta_1)\beta_2 = 3\beta_1\beta_2$, where $\beta_1$ and $\beta_2$ are the respective current gain factors of the transistors $T_1$ and $T_2$. As a result of the presence of the current-mirror circuit the overall current-gain factor of the arrangement is three times as large as the current gain factor of the conventional Darlington arrangement. Thus, in order to obtain a specific output current only one third of the base current required originally is necessary. For large output currents the load presented to the drive source then also remains small.

As an alternative to the current mirror circuit shown it is possible to employ other current mirror circuits, such as those described in the aforementioned article in Valvo Berichte.

A drawback of the Darlington transistor arrangement shown in FIG. 1 is that the decrease of the current gain factor of the output transistor in the case of large output currents given rise to a non-linear relationship between the output current and the base current of the input transistor.

Figure 2:
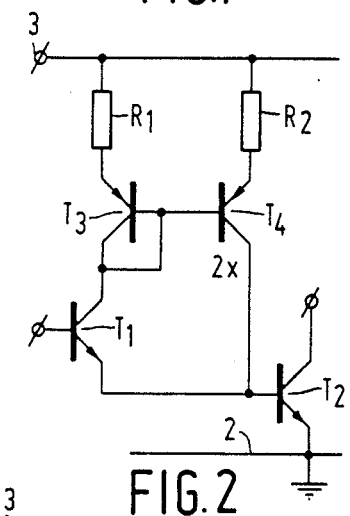
FIG. 2 shows a Darlington transistor arrangement forming a first embodiment of the invention.

FIG. 2 shows a Darlington transistor arrangement forming a first embodiment of the invention which does not have this drawback. Identical parts bear the same reference numerals as in FIG. 1. A resistor $R_1$, whose resistance value in the present example is equal to $R_1 = 6.2k\ \Omega$, is arranged in the emitter circuit of transistor $T_3$. Similarly, a resistor $R_2 = 500\ \Omega$ is arranged in the emitter circuit of transistor $T_4$. For small collector currents the voltages across the resistors $R_1$ and $R_2$ are low relative to the base-emitter voltages of transistors $T_3$ and $T_4$. The current gain of the current mirror circuit is then substantially equal to the ratio between the emitter areas of the transistors $T_4$ and $T_3$, i.e. in the present example it is equal to two. For large currents the current gain is substantially equal to the ratio between the resistors $R_1$ and $R_2$ owing to the small difference in the base-emitter voltages of the transistors $T_3$ and $T_4$, and in the present example it is equal to 12.4. The overall current gain factor of the arrangement consequently increases as the input currents increase. As a result of this, the decrease in the current gain factor of the output transistor for large currents is partly compensated for, so that a more linear relationship between the input and the output current is obtained. This reduces distortion of the output signal.

Figure 3:
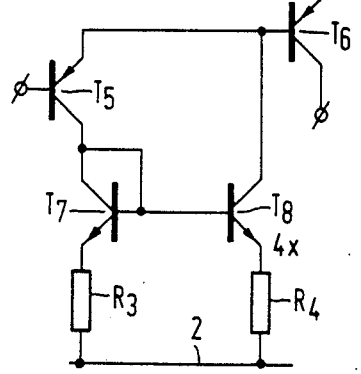
FIG. 3 shows a Darlington transistor arrangement forming a second embodiment of the invention.

FIG. 3 shows a Darlington transistor arrangement forming a second embodiment of the invention, in which the input transistor $T_5$ and the output transistor $T_6$ are PNP transistors instead of NPN transistors and in which the emitter of output transistor $T_6$ is connected to the positive instead of to the negative power-supply terminal. The collector of transistor $T_5$ is again connected to the input of a current mirror comprising an NPN transistor $T_7$ arranged as a diode and having a resistor $R_3 = 500\ \Omega$ arranged in its emitter circuit and an NPN transistor $T_8$ having an emitter area which is 4x as large as that of transistor $T_7$ and having a resistor $R_4 = 20\ \Omega$ arranged in its emitter circuit.

Further, the arrangement operates as in the same way as that shown in FIG. 2, the current gain factor of the current mirror circuit in the present example being 4 for small currents and being 25 for large currents.

Figure 4:
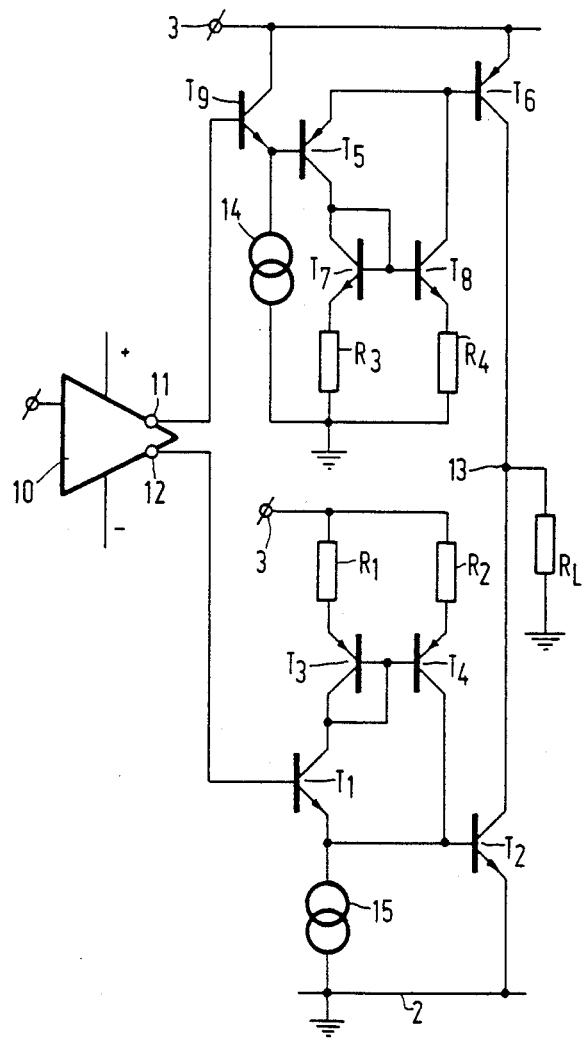
FIG. 4 shows schematically a push-pull amplifier provided with a Darlington transistor arrangement in accordance with the invention.

FIG. 4 shows schematically a push-pull amplifier provided with a Darlington arrangement in accordance with the invention. Corresponding parts bear the same reference numerals as in FIGS. 2 and 3. The push-pull amplifier comprises an input stage 10 having outputs 11 and 12 which drive the complementary output transistors $T_6$ and $T_2$ of the output stage. These transistors $T_6$ and $T_2$ have their emitters connected to the positive and to the negative power supply terminals, 3 and 2 respectively. The collectors are connected to the output 13 of the amplifier, to which a load $R_L$ is connected. The output transistor $T_2$ forms a Darlington arrangement with transistor $T_2$, as is shown in FIG. 2. A current source 15 is connected to the emitter of transistor $T_1$ to improve the linearity and high-frequency behaviour of the Darlington transistor. In the same way as shown in FIG. 3 the output transistor $T_6$ forms a Darlington arrangement with the transistor $T_5$. The base of transistor $T_5$ is driven by an emitter-follower transistor $T_9$. Thus, the base of transistor $T_6$ can be driven to the value of the positive supply voltage minus one base-emitter voltage. The emitter of transistor $T_9$ is connected to a current source 14 for the same reason as in the case of transistor $T_1$.

The scope of the invention is not limited to the embodiments shown. For example, in the embodiment shown in FIGS. 2 and 3 the resistors $R_2$ and $R_4$ may be dispensed with and in the embodiments shown in FIGS. 1, 2 and 3 a current source may be arranged in the emitter circuit of the input circuit. Within the scope of the present invention it is also possible to employ any other current mirror circuit instead of the current mirror circuit shown.

What is claimed is:

1. A Darlington transistor arrangement comprising an input transistor having a collector, a base and an emitter and an output transistor having a collector, a base and an emitter, the emitter of the input transistor driving the base of the output transistor, characterized in that the collector of the input transistor is connected to the input of a current amplifier circuit which amplifies the collector current of the input transistor and supplies it to an output which is connected to the base of the output transistor, the current amplifier circuit is a current mirror circuit comprising an input-current path which is connected to the collector of the input transistor and which comprises the series arrangement of the collector-emitter path of a first transistor and a first resistor, and an output current path which is connected to the base of the output transistor and which comprises the series arrangement of the collector-emitter path of a second transistor, whose base-emitter junction is arranged in parallel with the base-emitter junction of the first transistor, and a second resistor, and the ratio of the resistance value of the first to the second resistor is larger than the ratio of the emitter area of the second to the emitter area of the first transistor.

2. A Darlington transistor arrangement as claimed in claim 1, characterized in that the collector of the first transistor is connected to its base.

3. A Darlington transistor arrangement as claimed in claim 1, characterized in that the emitter of the input transistor is coupled to a current source.

4. A Darlington transistor arrangement as claimed in claim 1, characterized in that the input transistor is driven by an emitter-follower transistor of a conductivity type opposite to that of the input and the output transistor.

* * * * *